United States Patent [19]
Proebsting

[11] Patent Number: 5,737,267
[45] Date of Patent: Apr. 7, 1998

[54] WORD LINE DRIVER CIRCUIT

[75] Inventor: Robert J. Proebsting, Los Altos Hills, Calif.

[73] Assignee: Townsend and Townsend and Crew LLP, San Francisco, Calif.

[21] Appl. No.: 630,310

[22] Filed: Apr. 10, 1996

[51] Int. Cl.[6] .................................................. G11C 13/00
[52] U.S. Cl. ........................ 365/189.01; 365/203
[58] Field of Search ........................ 361/189.01, 189.09, 361/230.01, 203, 226

[56] References Cited

U.S. PATENT DOCUMENTS 5,471,425  11/1995  Yumitori et al. .................... 365/189.09

*Primary Examiner*—Terrell W. Fears
*Attorney, Agent, or Firm*—Townsend and Townsend and Crew LLP

[57] ABSTRACT

An improved method and circuit for a word line driver in memory integrated circuits is disclosed. Instead of connecting the gate terminal of an isolation transistor to a constant high power supply voltage, the present invention momentarily boosts the voltage at the gate terminal to allow for a full logic high voltage to be transferred to the gate terminal of a word line driver transistor. Then the voltage at the gate terminal of the isolation transistor is reduced to its original level before the signal at the drain terminal of the word line driver transistor is boosted from ground to voltages above the power supply level. Thus, a maximized boosted voltage is trapped at the gate terminal of the word line driver transistor to improve the drive capability of the word line driver transistor.

7 Claims, 3 Drawing Sheets

WORD LINE DRIVER CIRCUIT

BACKGROUND OF THE INVENTION

This invention relates in general to word line drivers in memory integrated circuits, and in particular to a word line driver circuit for a dynamic random access memory (DRAM) circuit to drive a word line above the positive supply voltage with improved drive capability.

Memory integrated circuits typically include a large number of memory cells located at the cross sections of word lines and bit lines. A word line is selected in response to externally supplied memory cell address information. The bit lines coupled to the selected word line carry the contents of the selected memory cells. The selection of a word line in a DRAM typically involves driving an interconnect line with a relatively heavy capacitive loading, from a low logic level of the negative supply voltage Vss, to a logic high voltage level above the positive supply voltage level. The gate capacitances for all of the memory cell access transistors coupled to each word line are the main contributors to the large capacitive loading for a word line. The circuit driving each word line must therefore be able to drive the heavily loaded line to the required high voltage level at the required speed.

FIG. 1 shows a typical prior art word line driver circuit. When the word line is selected, logic high address inputs at the inputs of an AND gate (NAND gate followed by an inverter) cause node N1 to be asserted to logic high (or the power supply) voltage Vcc. Node N3 is pulled down to logic low (e.g., ground) level by inverter 100, turning off transistor M3. With Vcc at its gate terminal, transistor M1 is turned on and provides a conductive channel between nodes N1 and N2. This allows the voltage at the gate terminal of the word line driver transistor M2 (node N2) to follow that of node N1 and rise, but only up to a level of Vcc-Vt, where Vt is the threshold voltage for M1. A clock signal $\phi 1$ is then applied to the drain terminal of word line driver transistor M2. As the signal $\phi 1$ rises from ground and moves toward a voltage larger than Vcc (e.g., 1.5×Vcc), the voltage at node N2 is bootstrapped upwards by the channel capacitance of transistor M2. Accordingly, ignoring the stray capacitances at node N2, the voltage at node N2 may rise to as high as approximately (Vcc-Vt) plus (1.5×Vcc). Thus, transistor M2 is biased on by a gate to source voltage of Vcc-Vt, giving it a certain level of conductivity.

For those memory circuits that are designed for low power supply voltages (e.g., 3.3 volts), a transistor threshold voltage (e.g., 0.8 v) is a significant percentage of the operating voltage. Thus, the impact of the loss of a threshold voltage is a lot more severe on the drive capability of the WL driver circuit operating at 3.3 v Vcc level than was the case for the same circuit operating at 5.0 v Vcc. To maintain the same drive capability at comparable speeds, the size of the driver transistor M2 would have to be enlarged in low voltage applications. This adds to circuit area and cost of manufacture.

There is therefore a need for a more efficient word line driver circuit in DRAMs, especially at lower power supply voltage levels.

SUMMARY OF THE INVENTION

The present invention provides a method and an apparatus for a memory circuit word line driver that maximizes the bias voltage of the driver transistor. Instead of connecting the gate terminal of the isolation transistor to a constant Vcc voltage, the present invention bootstraps the voltage at the gate terminal to allow for a full Vcc to be transferred to the gate terminal of the WL driver transistor. Then the voltage at the gate terminal of the isolation transistor is reduced down to Vcc level before the clock signal at the drain of the WL driver transistor bootstraps the voltage at the gate terminal of the WL driver transistor up to a high voltage level. Thus, a maximized bootstrapped voltage is trapped at the gate terminal of the WL driver transistor.

Accordingly, in one embodiment, the present invention provides in a memory circuit, a method for driving a word line which includes the steps of selecting a word line and applying a logic high voltage to an input of the WL driver circuit corresponding to the selected word line. The method further includes the steps of bootstrapping a voltage at the gate terminal of an isolation transistor inside the WL driver circuit to above the logic high voltage to transfer the full logic high voltage across its channel and to a gate terminal of a word line driver transistor. Next, the voltage at the gate terminal of the isolation transistor is lowered from its bootstrapped level to the logic high voltage. Finally, the voltage at the drain terminal of the WL driver transistor is bootstrapped from ground to a voltage above the logic high voltage level.

In another embodiment, the present invention provides in a memory circuit, a word line driver circuit having an input terminal and an output terminal coupled to the word line. The word line driver includes an isolation transistor having a first current-carrying terminal coupled to the input terminal, an isolation transistor driver circuit having an output terminal coupled to a gate terminal of the isolation transistor, and a word line driver transistor having a gate terminal coupled to a second current-carrying terminal of the isolation transistor. The word line driver transistor further includes a first current-carrying terminal coupled to a clock signal, and a second current-carrying terminal coupled to the word line. The isolation transistor driver circuit increases a voltage at the gate terminal of the isolation transistor above a logic high voltage level momentarily, and then decreases it back to the logic high voltage level.

A better understanding of the nature and advantages of the word line driver circuit of the present invention is gained by reference to the detailed description and the drawings below.

DESCRIPTION OF SPECIFIC EMBODIMENTS

Figure 1:
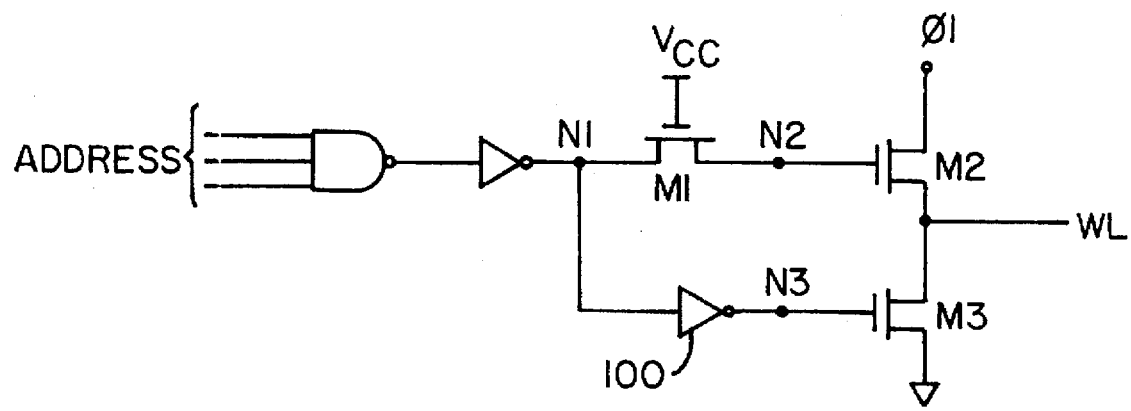
FIG. 1 is a schematic for a typical prior art word line driver circuit.
Figure 2:
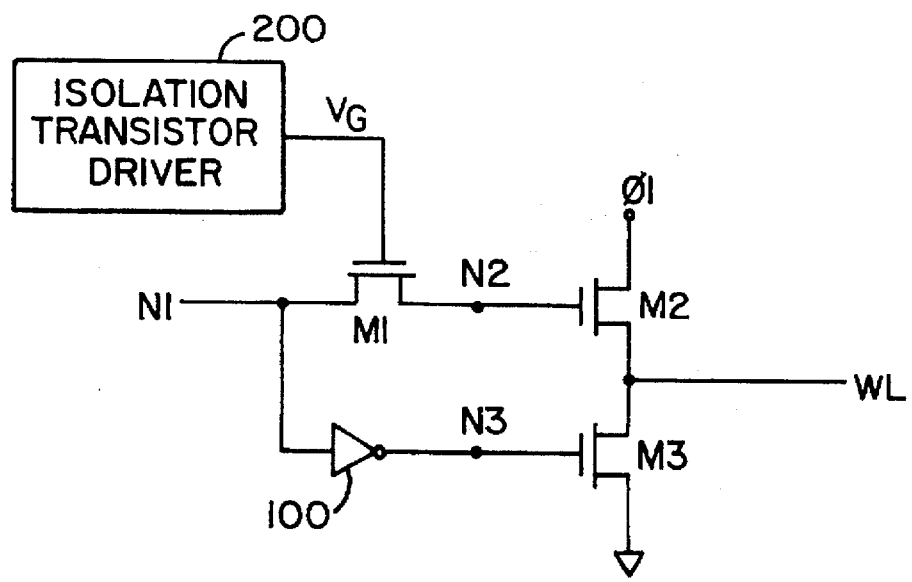
FIG. 2 is the word line driver circuit according to the present invention.

Referring to FIG. 2, the word line driver circuit of the present invention is shown as having an isolation transistor driver 200 with an output signal $V_G$ driving the gate terminal of transistor M1. Transistor M1 connects the input of the circuit (node N1) to the gate terminal (node N2) of the WL driver transistor M2. Transistor M3 also connects to the WL, pulling it down to ground when activated. The drain terminal of transistor M2 connects to a clock signal $\phi 1$ that supplies a boosted voltage to the WL.

In operation, driver 200 generates a $V_G$ signal that alternates between the logic high voltage (e.g., Vcc) and a boosted version of Vcc (e.g., 1.5×Vcc). Referring to the timing diagram shown in FIG. 3, initially and before the selection of the word line (i.e., with N1 at a logic low level), $V_G$ is at the higher voltage 1.5×Vcc. When this word line is selected, the voltage at node N1 moves to the logic high voltage Vcc. With $V_G$=1.5×Vcc, transistor M1 is turned on and its conductive channel allows the voltage at node N2 to follow N1 up toward Vcc. Because the gate voltage of transistor M1 is more than a threshold voltage Vt higher than Vcc, the voltage at N2 reaches a full Vcc level. At this point, driver 200 lowers the voltage at $V_G$ from its boosted level down to Vcc.

After $V_G$ is reduced to Vcc, the clock signal φ1 is boosted from ground to a voltage higher than Vcc, e.g., 1.5×Vcc. The channel capacitance of transistor M2 bootstraps the voltage at node N2 by an amount equal to 1.5×Vcc. Thus, the voltage at node N2 rises to as high as 2.5×Vcc (ignoring charge leakage due to stray capacitances at node N2). Reducing the voltage at $V_G$ back down to Vcc assures that there is no discharge path for the bootstrapping charge on node N2 as it moves up from Vcc toward 2.5×Vcc. Driver transistor M2 thus enjoys a large gate-to-source voltage, driving WL up to the boosted φ1 signal. The larger gate-to-source voltage reduces the size requirements for the driver transistor M2.

Figure 3:
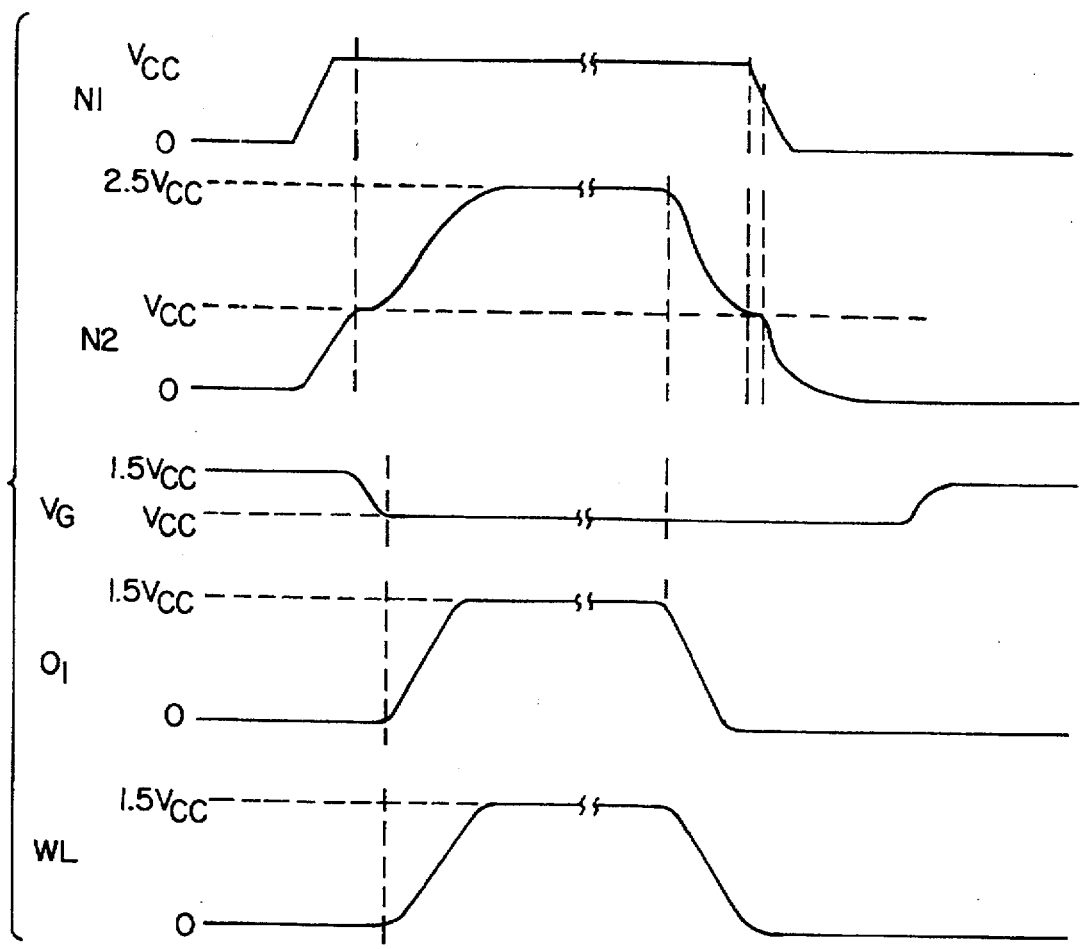
FIG. 3 is a timing diagram illustrating the operation of the word line driver circuit of the present invention.

Referring back to the timing diagram of FIG. 3, the deselection of the WL is preferably accomplished by lowering the voltage at φ1 and therefore WL down to ground before node N1 is de-asserted. This avoids turning on transistor M3 when a very large drain-to-source voltage exists across transistor M3 which could cause reliability problems.

Figure 4:
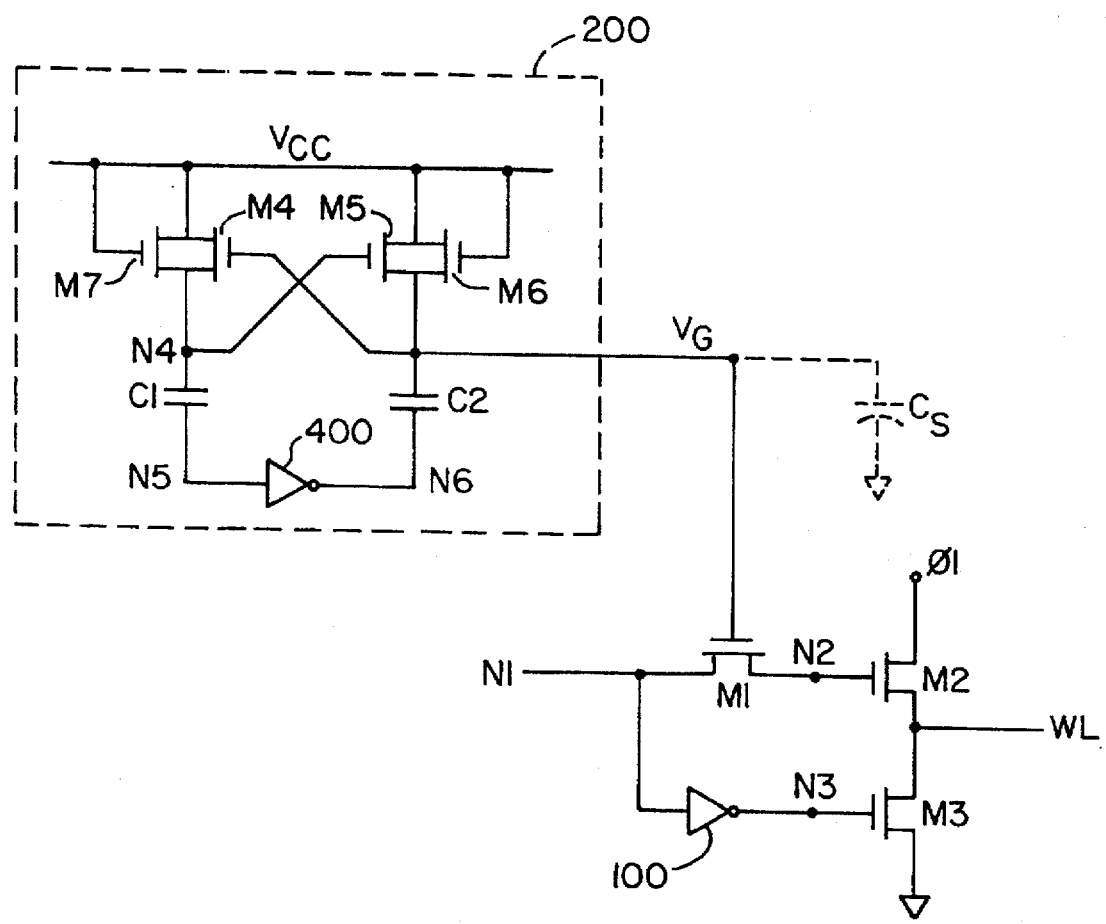
FIG. 4 shows an exemplary embodiment of the word line driver circuit in greater detail.

FIG. 4 shows an exemplary circuit embodiment for the isolation transistor driver block 200. The circuit includes a pair of transistors M4 and M5 coupled to Vcc with cross-coupled gate/drain terminals. Diode-connected transistors M6 and M7 connect in parallel to transistors M5 and M4, respectively, and act as start-up devices. Top plates of bootstrap capacitors C1 and C2 connect to the drain terminals of transistors M4 and M5 (nodes N4 and $V_G$), respectively. An inverter 400 connects between the bottom plates of bootstrap capacitors C1 and C2, nodes N5 and N6, respectively.

Assuming that the voltages at nodes N5 and N6 have been at a logic low (ground) level and Vcc, respectively, for a long time, charge leakage through the n-type drain regions of transistors M4 and M7 in the negative p-type substrate, would attempt to move the voltage at node N4 down toward ground. However, diode-connected transistor M7 prevents the voltage at node N4 from dropping more than one threshold (Vt of M7) below Vcc. The voltage at $V_G$ would also be at Vcc-Vt. When the voltage at node N5 switches from ground to logic high (Vcc), inverter 400 causes node 6 to switch down to ground. As N5 moves toward Vcc, the voltage at node N4 is bootstrapped by capacitor C1 upward by the same amount. Thus, the voltage at node N4 reaches 2 Vcc-Vt at a time when transistor M4 is off. With 2 Vcc-Vt at its gate terminal, transistor M5 pulls $V_G$ up to full Vcc, while node N6 is at ground. Thus, when the voltage at node N5 switches to up Vcc, $V_G$ switches down to full Vcc.

When the voltage at node N5 switches back to ground, node N6 switches to Vcc. This time the rise in the voltage at node N6 causes the bootstrapping of $V_G$ through capacitor C2 up to 2 Vcc, (assuming zero stray capacitance Cs). With 2 Vcc at its gate terminal, transistor M4 maintains a full Vcc value at node N4, which turns off transistor M5. Thus, when the voltage at node N5 switches to ground, $V_G$ switches to 2 Vcc.

The output of the driver circuit 200 drives a large number of word line driver circuits. Thus, the signal $V_G$ must drive a good size stray capacitance $C_S$ (shown in phantom in FIG. 4). This stray capacitance $C_S$ forms a voltage divider with capacitor C2. Given a C2 capacitance that is approximately equal to that of $C_S$, when the voltage at node N6 switches from ground to Vcc, node $V_G$ is bootstrapped upward by one half Vcc (for a total value of 1.5×Vcc). Since transistor M5 does not allow the voltage at $V_G$ to go below Vcc, when node N6 is low, the impact of the capacitive divider is to cause the voltage at $V_G$ to alternate between Vcc and 1.5×Vcc. Thus, once the circuit starts to switch, it generates the desired voltage at $V_G$ switching between Vcc and 1.5×Vcc.

In conclusion, the present invention provides an improved method and a circuit for driving a word line in a memory circuit. The present invention momentarily bootstraps the voltage at the gate terminal of an isolation transistor to allow for a full logic high level to be transferred to the gate terminal of a WL driver transistor. This maximizes the bootstrapped bias voltage for the WL driver transistor to improve its driving capability. While the above is a is a complete description of specific embodiments of the present invention, various modifications, variations and alternatives may be employed. The scope of this invention, therefore, should not be limited to the embodiments described, and should instead be defined by the following claims.

What is claimed is:

1. A word line driver circuit having an output terminal coupled to a word line, and an input terminal, the word line driver circuit comprising:

an isolation transistor having a first terminal coupled to the input terminal; and a word line driver transistor having a gate terminal coupled to a second terminal of said isolation transistor, a first terminal coupled to a boost signal, and a second terminal coupled to the word line, wherein, a voltage at said gate terminal of said isolation transistor is momentarily boosted above a logic high voltage level.

2. The word line driver circuit of claim 1 further comprising an isolation transistor driver circuit having an output terminal coupled to a gate terminal of the isolation transistor, said isolation transistor driver circuit momentarily boosting a voltage at its output terminal from said logic high voltage level to a voltage above said logic high voltage level.

3. The word line driver circuit of claim 2 further comprising:

an inverter having an input terminal coupled to the word line driver circuit input terminal, and an output terminal; and a pull-down transistor having a gate terminal coupled to said output terminal of said inverter, a first terminal coupled to the word line, and a second terminal coupled to a lower power supply voltage.

4. The word line driver circuit of claim 2 wherein said isolation transistor driver circuit comprises:

a first and second transistors having cross-coupled gate and drain terminals, and source terminals coupled to a higher power supply voltage;

a first capacitor having a first terminal coupled to a drain terminal of said first transistor;

a second capacitor having a first terminal coupled to a drain terminal of said second transistor and to said output terminal of said isolation transistor driver circuit; and an inverter having an input terminal coupled to a second terminal of said first capacitor, and an output terminal coupled to a second terminal of said second capacitor.

5. The word line driver circuit of claim 4 further comprising a first and second diode-connected transistors coupled in parallel with said first and second transistors, respectively.

6. A circuit for driving a word line, comprising:

a first transistor having a first terminal receiving an input select signal, a second terminal, and a gate terminal;

a second transistor having a first terminal receiving a boosted signal, a second terminal coupled to the word line, and a gate terminal coupled to said second terminal of said first transistor;

an inverter having an input terminal coupled to said first terminal of said first transistor, and an output terminal;

a third transistor having a first terminal coupled to the word line, a second terminal coupled to a reference voltage, and a gate terminal coupled to said output of said inverter; and a driver circuit having an output coupled to said gate terminal of said first transistor, wherein, said driver circuit momentarily boosts a voltage at said gate terminal of said first transistor from a logic high reference voltage to a voltage above said logic high reference voltage.

7. A method for driving a word line in a memory circuit, the method comprising the steps of:

(A) selecting a word line;

(B) applying a logic high voltage to an input terminal of an isolation transistor inside a word line driver circuit corresponding to the selected word line;

(C) momentarily boosting a voltage at a gate terminal of said isolation transistor to a voltage above said logic high voltage to transfer a full logic high voltage across its channel and to a gate terminal of a word line driver transistor;

(D) boosting a voltage at a drain terminal of said word line driver transistor to a voltage above the logic high voltage level after said voltage at said gate terminal of said isolation transistor is reduced back to its original voltage level.

* * * * *